United States Patent
Cho et al.

(10) Patent No.: US 7,417,896 B2
(45) Date of Patent: Aug. 26, 2008

(54) FLASH MEMORY DEVICE CAPABLE OF REDUCED PROGRAMMING TIME

(75) Inventors: Ji-Ho Cho, Suwon-si (KR); Myong-Jae Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 244 days.

(21) Appl. No.: 11/302,440

(22) Filed: Dec. 14, 2005

(65) Prior Publication Data

US 2006/0126399 A1 Jun. 15, 2006

(30) Foreign Application Priority Data

Dec. 14, 2004 (KR) .................... 10-2004-0105622

(51) Int. Cl.
*G11C 16/04* (2006.01)
*G11C 16/06* (2006.01)

(52) U.S. Cl. ................. 365/185.18; 365/185.23; 365/185.28

(58) Field of Classification Search ........... 365/185.18, 365/185.28, 185.23
See application file for complete search history.

(56) References Cited

U.S. PATENT DOCUMENTS

| 5,943,260 A | 8/1999 | Hirakawa | 365/185.03 |
| 6,882,567 B1 * | 4/2005 | Wong | 365/185.03 |
| 2003/0048667 A1 | 3/2003 | Mori et al. | 365/185.33 |
| 2007/0081392 A1 * | 4/2007 | Park et al. | 365/185.23 |

FOREIGN PATENT DOCUMENTS

| JP | 08235871 A | 9/1996 |
| JP | 10083686 | 3/1998 |
| JP | 10-188579 | 7/1998 |
| JP | 10-188586 | 7/1998 |
| JP | 2000-222886 | 8/2000 |
| KR | 1020000027295 | 5/2000 |
| KR | 1020010003292 | 1/2001 |
| KR | 1020010060555 | 7/2001 |
| KR | 1020040008533 | 1/2004 |
| KR | 1020040079464 | 9/2004 |
| KR | 1020050075548 A | 7/2005 |

OTHER PUBLICATIONS

Nobukata, H. et al., A 144-mb, eight-level NAND flash memory with optimized pulsewidth programming, IEEE Journal of Solid-State Circuits, May 2000, pp. 682-690, vol. 35, No. 5.

Kang-Deog Suh et al., TA7.5: A 3.3V 32Mb NAND Flash Memory with Incremental Step Pulse Programming Scheme, Digest of Technical Papers, Feb. 16, 1995, pp. 128-130, IEEE ISSCC95.

* cited by examiner

*Primary Examiner*—Lý Duy Pham
(74) *Attorney, Agent, or Firm*—Volentine & Whitt, PLLC

(57) ABSTRACT

A flash memory device and related method of operation are provided. The device generally comprises a word line voltage generator circuit configured to generate a word line voltage based on incremental step pulse programming; and a word line voltage controller circuit that controls the word line voltage generator circuit so that either the unit program time or the increment size of the word line voltage is varied according to the number of program data bits among the set of input data bits that the device will store in memory cells.

12 Claims, 6 Drawing Sheets

(t' < t)

FLASH MEMORY DEVICE CAPABLE OF REDUCED PROGRAMMING TIME

BACKGROUND OF THE INVENTION

1. Field of the Invention

The present invention is related to a semiconductor memory device, and, in particular, a NOR flash memory device.

This application claims the benefit of Korean Patent Application No. 2004-105622, filed Dec. 14, 2004, the disclosure of which is hereby incorporated by reference in its entirety.

2. Description of Related Art

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families. Semiconductor memory devices generally include volatile memory devices, such as random access memory (RAM) devices, and nonvolatile memory devices. In RAM devices, data is stored by either establishing the logic state of a bistable flip-flop such as in a static random access memory (SRAM), or by charging a capacitor in a dynamic random access memory (DRAM). In both SRAM and DRAM devices, data remains stored and may be read as long as the power is applied, but data is lost when the power is turned off.

In contrast, nonvolatile memories are capable of storing data even when the power is turned off. Nonvolatile memory data storage modes include permanent and reprogrammable modes. Nonvolatile memories are commonly used for program and microcode storage in a wide variety of applications including computers, avionics, telecommunications, and consumer electronics. A combination of volatile and nonvolatile memory devices and related storage modes are available in devices such as nonvolatile SRAM (nvRAM) devices. These devices are used, for example, in systems that require fast, reprogrammable nonvolatile memory.

Mask read-only memory (MROM), programmable read-only memory (PROM) and erasable programmable read-only memory (EPROM) nonvolatile memory devices are not readily writeable or erasable, so it is not easy to update the contents of the memory. On the other hand, electrically erasable programmable read-only memory (EEPROM) nonvolatile memory devices are electrically erasable and writable, and may, thus, be readily applied to auxiliary memories or system programming memories that require continuous update.

Flash memory, which is a type of EEPROM, is one example of a nonvolatile memory device. While standard EEPROM can only erase or write one byte of data in a single programming operation, flash memory can erase or write multiple bytes, or "blocks", of data in a single programming operation.

Flash memory devices store data on a silicon chip in such a way that even if the power to the chip is turned off, the data is retained on the chip. The two general types of flash memory are NOR flash memory and NAND flash memory. NOR flash memory uses a NOR logic gate in each cell while NAND flash memory uses a NAND logic gate in each cell. In flash memory devices, each cell can typically store one bit of data, though there are also multi-bit flash memory devices in which each cell can store two or more bits of data. In flash memory devices, cells are arranged in rows and columns to form an array of cells.

The following is an exemplary configuration of a flash memory cell. In a flash memory cell, a bit line and a word line are connected to the cell, which comprises a control gate, a floating gate, a substrate with a source and a drain, and two oxide layers. The cell is arranged so that the word line is connected to the control gate, and the bit line is connected to the substrate, with the floating gate between the control gate and the substrate. Between the control gate and the floating gate is the first oxide layer, and between the floating gate and the substrate is the second oxide layer.

The data state of the cell is determined by the threshold voltage of the cell. A cell having a low threshold voltage corresponds to the data state "1", or "erased", for the data bit held in the cell, and a high threshold voltage corresponds to the data state "0", or "programmed", for the data bit held in the cell. The cell is brought from the erased state to the programmed state using a process called Fowler-Nordheim tunneling. To program the cell using Fowler-Nordheim tunneling, the word line supplies the control gate with a high voltage, while the bit line supplies the substrate with a low voltage, creating a voltage difference between the control gate and the substrate strong enough to pull electrons out of the substrate towards the floating gate. The electrons are then trapped between the control gate and the first oxide layer creating a barrier between the control gate and the floating gate and raising the threshold voltage of the cell to a value associated with the programmed state. Cells can typically be programmed by the byte or by the word.

To erase the cell, the bit line supplies a high voltage to the substrate and the word line supplies a low voltage to the control gate causing a voltage difference between the control gate and the substrate that causes the trapped electrons to be pulled back across the first oxide layer and into the substrate, removing the barrier that the electrons formed and reducing the threshold voltage of the cell to a value associated with the erased state. Cells cannot be erased individually, but rather the cells are erased by the block.

To read the state of the cell, a voltage is applied to the control gate and the cell will either provide a relatively high voltage to the bit line, which the flash memory device reads as the cell having a programmed state, or a relatively low voltage, which the flash memory device reads as the cell having an erased state.

NOR flash memory devices perform programming operations within program loops, each of which consists of a program interval and a program verify interval. In each program loop, the device programs memory cells during the program interval and checks whether or not memory cells are programmed during the program verify interval. A time period (hereinafter, referred to as "programming time") of sufficient duration to execute each program interval is provided during each program loop. Programming time is defined as the time required to program memory cells as described above when each bit in the set of input data bits has a logical value "0". The voltage level applied to a bit line is a critical consideration in the determination of programming time. This consideration arises from the fact that the applied bit line voltage is generally lower than a defined threshold voltage during this period of programming operations. Hence, the programming time of each program loop is set to the maximum programming time required to program the memory cells, under the condition that each bit in the set of input data bits has a logical value "0". Hereinafter, a data bit having a logical value "0" is called a "program data bit" and a data bit having a logical value "1" is called a "program-inhibit data bit".

Conventionally, a programming time has been determined by the above condition and used for all inputs, even when some of the input bits in the input are program-inhibit data bits rather than program data bits. Maintaining a constant programming time regardless of the number of program data bits actually apparent in the input data slows the performance of the NOR flash memory device.

Accordingly, a technique capable of improving the programming performance of the NOR flash memory device is required.

SUMMARY OF THE INVENTION

In one embodiment, the invention provides a flash memory device comprising word line voltage generator circuit configured to generate a word line voltage, wherein the word line voltage is varied in accordance with an increment size, and a program controller circuit adapted to control the word line voltage generator circuit and further adapted to define the increment size in accordance with a number of program data bits in a set of input data bits.

In another embodiment, the invention provides a flash memory device comprising a word line voltage generator circuit configured to generate a word line voltage, wherein the word line voltage is varied in accordance with an increment size, and a program controller circuit adapted to control the word line voltage generator circuit and further adapted to define a unit program time for the word line voltage in accordance with a number of program data bits in a set of input data bits.

In yet another embodiment, the invention provides, a method for controlling a flash memory device is provided which comprises generating a word line voltage, wherein the word line voltage is varied in accordance with an increment size, and defining the increment size in accordance with a number of program data bits in a set of input data bits.

In still another embodiment, the invention provides a method for controlling a flash memory device is provided which comprises generating a word line voltage, wherein the word line voltage is varied in accordance with an increment size, and defining a unit program time in accordance with a number of program data bits in a set of input data bits.

BRIEF DESCRIPTION OF THE DRAWINGS

An appreciation of the present invention, and many of its attendant advantages, will become readily apparent upon consideration of embodiments of the invention with reference to the accompanying drawings in which like reference symbols indicate the same or similar components, wherein.

DESCRIPTION OF THE EXEMPLARY EMBODIMENTS

Figure 1:
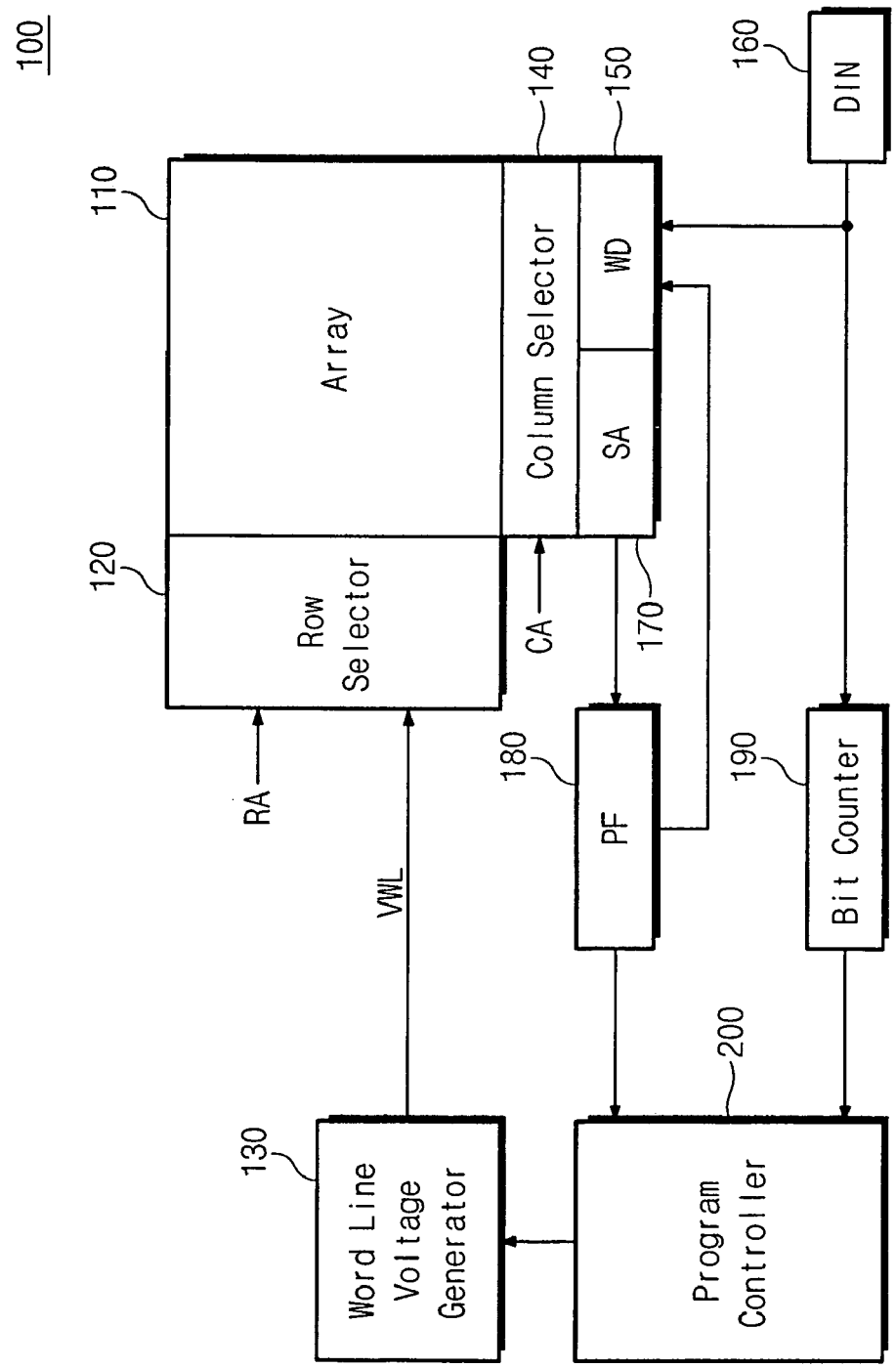
FIG. 1 shows a block diagram of a NOR flash memory device according to one embodiment of the present invention.

FIG. 1 is a block diagram showing a nonvolatile memory device according to one embodiment of the invention. A NOR flash memory device is illustrated in FIG. 1. However, those of ordinary skill in the art will understand that the invention may be applied to other types of memory devices such as MROM, PROM, ferroelectric random access memory (FRAM), a NAND flash memory device, etc.

Referring to FIG. 1, a NOR flash memory device 100 is shown and generally includes a memory cell array 110 comprising nonvolatile memory cells arranged in an array of word lines (or rows) and bit lines (or columns). A row selector circuit 120 selects at least one of the word lines in response to a row address RA and supplies a word line voltage VWL to the selected word line. A word line voltage generator circuit 130 is controlled by a program controller circuit 200 and generates the word line voltage VWL to be supplied to the selected word line. In the illustrated example, word line voltage generator circuit 130 is configured to generate the word line voltage VWL using incremental step pulse programming (ISPP) within the overall programming operation. In ISPP, the word line voltage VWL is increased stepwise from a minimum voltage (for example, 2V) to a maximum voltage (for example, 9V) within the program interval of each program loop. Program controller circuit 200 may vary the increment size for the word line voltage VWL in accordance with the number of program data bits in a set of input data bits. Alternatively, the program controller circuit 200 may vary the unit program time in accordance with the number of program data bits in the set of input data bits. Herein, the unit program time is a time within a program interval where the level of word line voltage VWL is maintained, and between which the word line voltage is incremented.

A column selector circuit 140 selects bit lines of memory cell array 110 according to a defined unit size (for example, x8, x16, x32, etc.) in response to a column address CA. During a programming operation, a write driver circuit 150 temporarily stores data values transferred via a data input circuit 160 and drives bit lines, which are selected by column selector circuit 140, with a bit line voltage in accordance with the stored data values. During a read/verify operation, a sense amplifier circuit 170 senses and amplifies the logic states, either programmed or erased, of memory cells via bit lines selected by column selector circuit 140. During the verify operation, a pass/fail check circuit 180 outputs a judgment result to program controller circuit 200 in response to the states of the memory cells sensed by pass/fail check circuit 180. The sensed state for each one of the memory cells is provided to write driver circuit 150, so that programmed memory cells may be program-inhibited, if desired.

For example, assume that the data value to be programmed in a memory cell is "0". If the sensed state of the memory cell is "1" indicating an erased state, the data value temporarily stored in write driver circuit 150 for the memory cell is maintained at "0". This means that the memory cell must be programmed within the next program loop. That is, a bit line voltage is supplied to the bit line which is connected to the memory cell to be programmed.

If, however, the sensed state of the memory cell is "0" indicating a programmed state, the data value temporarily stored in write driver circuit 150 for the memory cell is changed from "0" to "1". This means that the memory cell must be program-inhibited within the next program loop.

During the programming operation, data input circuit 160 provides both write driver circuit 150 and bit counter circuit 190 with the set of input data bits. Bit counter circuit 190 counts (or calculates) the number of program data bits in the set of input data bits. Bit counter circuit 190 then provides program controller circuit 200 with the number of counted program data bits. Program controller circuit 200 is configured to control overall operation of the program loops. Program controller circuit 200 controls word line voltage generator circuit 130 so that the word line voltage VWL increment size is maintained at a reference value or increased above the reference value in accordance with the number of program data bits determined by bit counter circuit 190. Alternatively, program controller circuit 200 controls word line voltage generator circuit 130 so that the unit program time is maintained at the reference value or decreased below the reference value in accordance with the number of program data bits determined by bit counter circuit 190.

In one embodiment of the invention, the foregoing reference value for voltage is a voltage that corresponds to a voltage required when the set of input data bits contains all program data bits, and the foregoing reference value for unit program time is a time that corresponds to the unit program time required when the set of input data bits contains all program data bits.

Figure 2A:
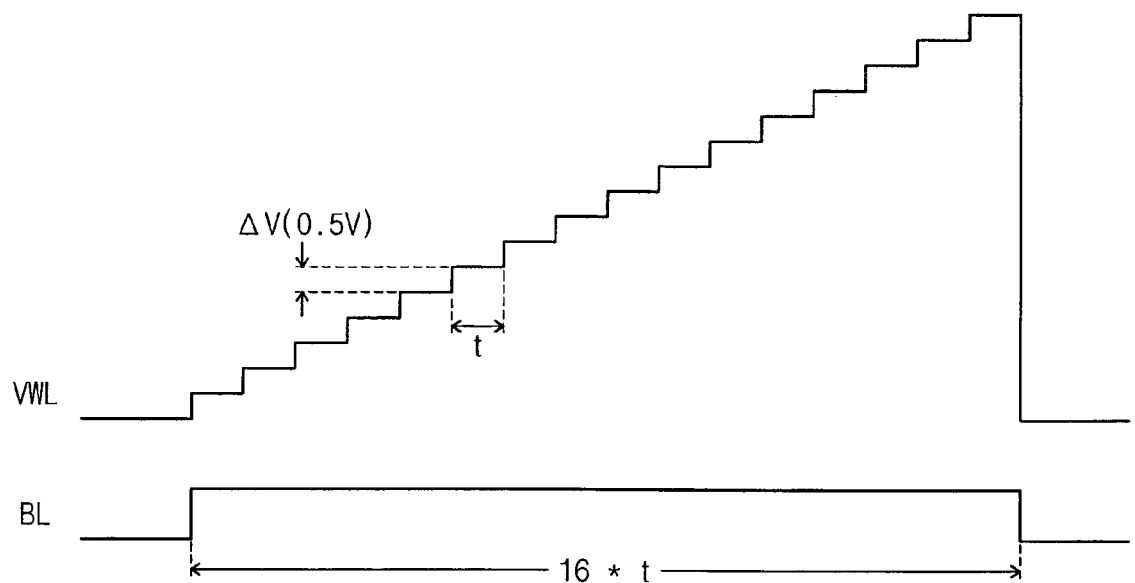
FIGS. 2A to 2C show word line voltage increment size variations for a programming operation of a NOR flash memory device in FIG. 1.
Figure 2B:
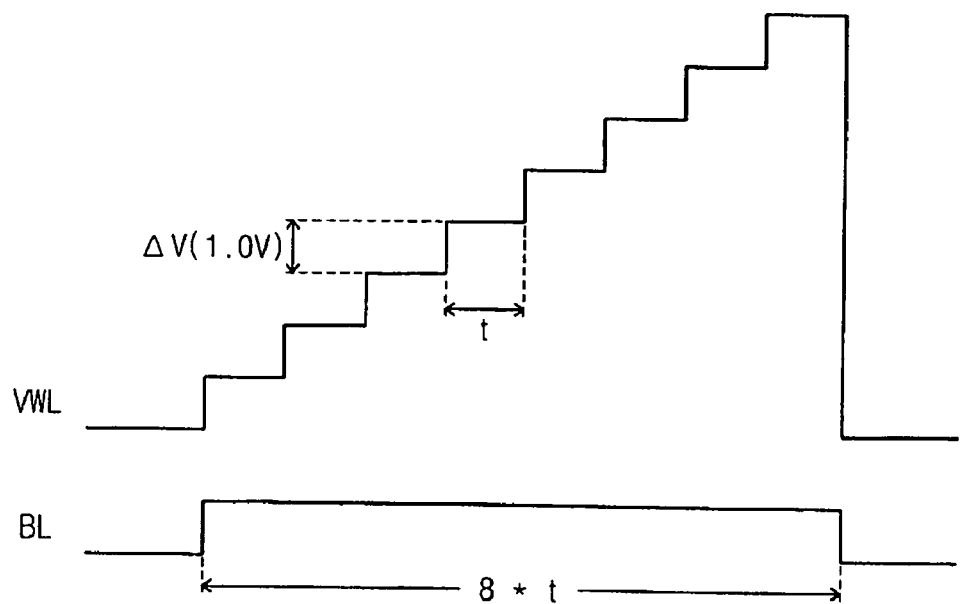
Figure 2C:
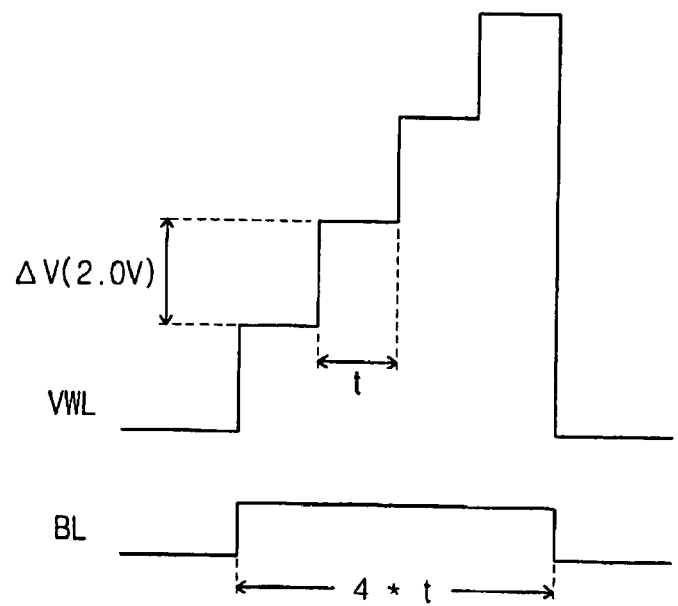

FIGS. 2A through 2C are voltage diagrams showing exemplary word line voltage variations for defining a programming operation of a NOR flash memory device like the one shown in FIG. 1. For example, prior to the exemplary programming operations shown in FIGS. 2A through 2C, it is assumed that the exemplary NOR flash memory device 100 shown in FIG. 1 has been configured to variously control the increment size of a word line voltage VWL according to whether a number of program data bits is greater than 8, whether it is less than or equal to 8 but greater than 4, or whether it is less than or equal to 4. These definitions are just selected examples, and those of ordinary skill in the art will understand that any reasonable definition is possible.

Once NOR flash memory device 100 enters a programming mode of operation, data input circuit 160 inputs a data word comprising the set of input data bits. Since NOR flash memory device 100 will be programmed in relation to this data word it is temporarily stored in write driver circuit 150. Bit counter circuit 190 calculates the number of program data bits from the set of input data bits. If the calculated number of program data bits is greater than 8, as illustrated in FIG. 2A, program controller circuit 200 controls word line voltage generator circuit 130 so that it increases the word line voltage VWL stepwise by an increment size ($\Delta V$) of 0.5V. If the calculated number of program data bits is less than or equal to 8 but greater than 4, as illustrated in FIG. 2B, program controller circuit 200 controls word line voltage generator circuit 130 so that it increases the word line voltage VWL stepwise by an increment size ($\Delta V$) of 1.0V. If the calculated number of program data bits is less than or equal to 4, as illustrated in FIG. 2C, program controller circuit 200 controls word line voltage generator circuit 130 so that it increases the word line voltage VWL stepwise by an increment size ($\Delta V$) of 2.0V. Thus, illustrated in FIGS. 2A through 2C, the increment size of the word line voltage VWL is varied in accordance with the number of program data bits while the unit program time (t) is held constant.

The word line voltage VWL generated by word line voltage generator circuit 130 supplied to a word line selected by row selector circuit 120. Write driver circuit 150 drives bit lines selected by column selector circuit 140 with a bit line voltage, defined in relation to the set of input data bit values. As described above, in the case where the input data bit is a program data bit, a bit line voltage is supplied to a bit line. On the other hand, if the input data bit is a program-inhibit data bit, no bit line voltage is supplied to a bit line. Once a word line voltage VWL is supplied to a selected word line and a bit line voltage is supplied to a selected bit line, the flash memory device starts to program a memory cell as described above. When the program interval of a program loop has ended, program controller circuit 200 detects whether threshold voltages of programmed memory cells have been properly shifted to the desired threshold voltage. This is accomplished using sense amplifier circuit 170 and pass/fail check circuit 180 in a conventional manner.

If the flash memory device determines that the threshold voltages of programmed memory cells have been properly shifted to the desired threshold voltage, then the flash memory device determines that the current program loop is successful, e.g., "program pass", and the program mode of operation ends. On the other hand, if the flash memory device determines that the threshold voltages of programmed memory cells have not been properly shifted to the desired threshold voltage, then the flash memory device determines that the current program loop is not successful, e.g., "program fail", and program controller circuit 200 performs a repeated program loop, which is another programming operation executed under the same configuration using, for example, one of the configurations described in relation to FIGS. 2A to 2C to essentially repeat the program loop.

So, in the flash memory device according to one embodiment of the invention, an initially determined configuration is maintained until the program mode of operation is ended, and thus, repeated program loops may be executed with the same voltage increment size established in the initial program loop.

In the foregoing embodiment, bit counter circuit 190 and program controller circuit 200 constitute a word line voltage controller circuit, of sorts, configured to control the word line voltage generator circuit to vary the increment size of the word line voltage or the unit program time in accordance with the number of program data bits in a set of input data bits to be stored in selected memory cells.

As set forth above, when each bit in the set of input data bits is a program data bit, the word line voltage increment size is set at a minimum value. However, it is possible to increase the voltage increment size when there are fewer program data bits in the set of input data bits. For example, when performing a programming operation according to the configuration described in relation to FIG. 2A, which is defined in the illustrated example according to a number of program data bits greater than 8, the programming time for each program loop is set at, for example, 16t. As another example, when performing a programming operation according to the configuration described in relation to FIG. 2B, which is defined in the illustrated example according to a number of program data bits less than or equal to 8 but greater than 4, the programming time for each program loop is set at, for example, 8t. As still another example, when performing a programming operation according to the configuration in relation to FIG. 2C, which is defined in the illustrated example according to a number of program data bits less than or equal to 4, the programming time of each program loop is set at, for example, 4t. Thus, it is possible to reduce the programming time for each program loop (or an overall programming time) based on the number of program data bits apparent in a set of input data bits by variably controlling the increment size of the word line voltage VWL accordingly.

Figure 3A:
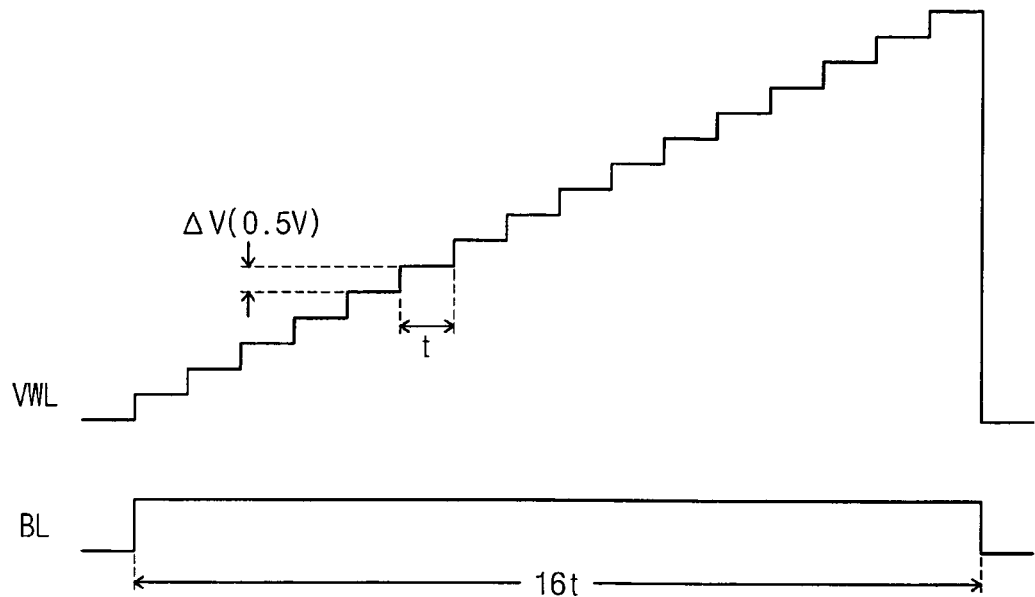
FIGS. 3A to 3C show variations in the unit program time for a programming operation of a NOR flash memory device in FIG. 1.
Figure 3B:
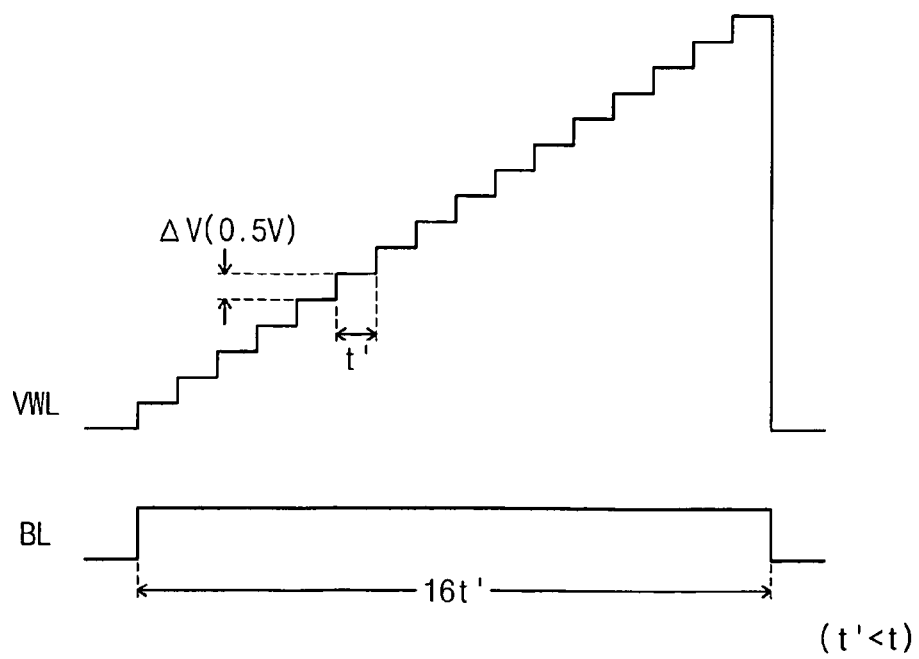
Figure 3C:
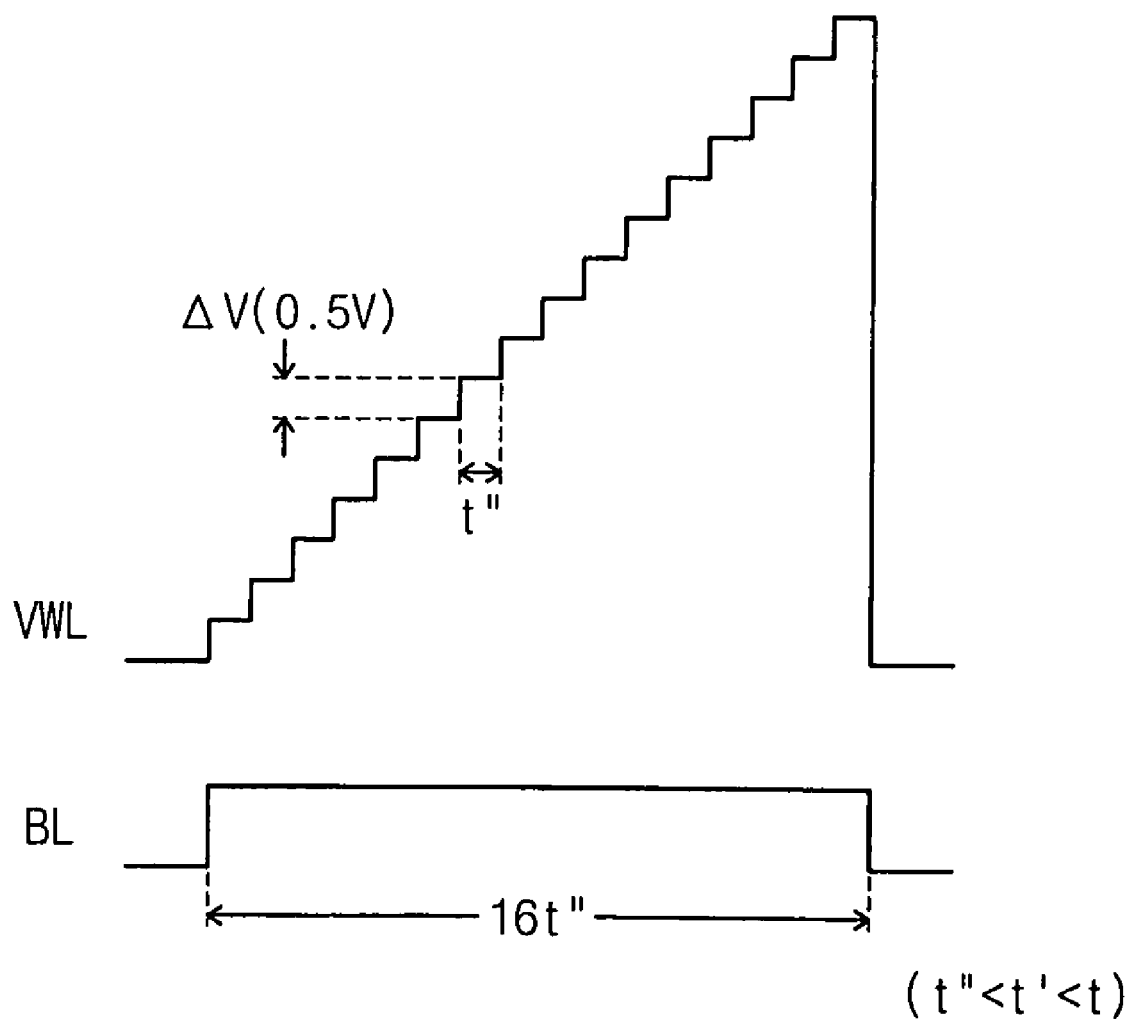

FIGS. 3A through 3C are voltage diagrams showing exemplary unit program time variations for defining a programming operation of a NOR flash memory device like the one shown in FIG. 1.

For example, prior to describing the exemplary programming operations shown in FIGS. 2A through 2C, it is assumed that the exemplary NOR flash memory device 100 shown in FIG. 1 has been configured to variously control the unit program time according to whether a number of program data bits is greater than 8, whether it is less than or equal to 8 but greater than 4, or whether it is less than or equal to 4. These definitions are just selected examples, and those of ordinary skill in the art will understand that any reasonable definition is possible.

Once NOR flash memory device 100 enters a programming mode of operation, data input circuit 160 inputs a data word comprising the set of input data bits. Since NOR flash memory device 100 will be programmed in relation to this data word it is temporarily stored in write driver circuit 150. Bit counter circuit 190 calculates the number of program data bits in the set of input data bits. If the calculated number of program data bits is greater than 8, as illustrated in FIG. 3A, program controller circuit 200 controls word line voltage generator circuit 130 so that the unit program time is set to a time (t) during the program interval. If the calculated number of program data bits is less than or equal to 8 but greater than 4, as illustrated in FIG. 3B, program controller circuit 200 controls word line voltage generator circuit 130 so that the unit program time during the program interval is set to a time (t') that is shorter than the time (t) (t>t'). If the calculated number of program data bits is less than or equal to 4, as illustrated in FIG. 3C, program controller circuit 200 controls the word line voltage generator circuit 130 so that the unit program time during the program interval is set to a time (t") that is shorter than the time (t') (t>t'>t"). Thus, as illustrated in FIGS. 3A through 3C, the unit program time is varied in accordance with the number of program data bits while the increment size (ΔV) of the word line voltage VWL held constant.

The word line voltage VWL generated by word line voltage generator circuit 130 is supplied to a word line selected by row selector circuit 120. Write driver circuit 150 drives bit lines selected by the column selector circuit 140 with a bit line voltage, defined in relation to input data states. As described above, in the case where an input data bit is a program data bit, a bit line voltage is supplied to a bit line. On the other hand, if an input data bit is a program-inhibit data bit, no bit line voltage is supplied to a bit line. Once a word line voltage VWL is supplied to a selected word line and a bit line voltage is supplied to a selected bit line, the flash memory device starts to program a memory cell. When the program interval of a program loop has ended, program controller circuit 200 detects whether threshold voltages of programmed memory cells have been properly shifted to the desired threshold voltage. This is accomplished using sense amplifier circuit 170 and pass/fail check circuit 180 in a conventional manner.

If the flash memory device determines that the threshold voltages of programmed memory cells have been properly shifted to the desired threshold voltage, then the flash memory device determines that the current program loop is successful, e.g., "program pass", and the program mode of operation ends. On the other hand, if the flash memory device determines that the threshold voltages of programmed memory cells have not been properly shifted to the desired threshold voltage, then the flash memory device determines that the current program loop is not successful, e.g., "program fail", and program controller circuit 200 executes another programming operation under the same configuration using, for example, one of the configurations described in relation to FIGS. 3A to 3C to essentially repeat the program loop.

So, in the flash memory device according to one embodiment of the invention, an initially determined configuration is maintained until the program mode of operation is ended, and thus, repeated program loops may be performed with the same unit program time established in the initial program loop.

As set forth above, when each bit in the set of input data bits is a program data bit, the length of the unit program time is set at a maximum value. However, it is possible to shorten the unit program time when there are fewer program data bits in the set of input data bits. For example, when performing a programming operation according to the configuration described in relation to FIG. 3A, which is defined in the illustrated example according to a number of program data bits greater than 8, the programming time for each program loop is set at, for example, 16t. As another example, when performing a programming operation according to the configuration described in relation to FIG. 3B, which is defined in the illustrated example according to a number of program data bits less than or equal to 8 but greater than 4, the programming time of each program loop is set at, for example, 16t' (t>t'). As still another example, when performing a programming operation according to the configuration described in relation to FIG. 3C, which is defined in the illustrated example according to a number of program data bits less than or equal to 4, the programming time of each program loop is set at, for example, 16t" (t>t'>t"). Thus, it is possible to reduce the programming time for each program loop (or an overall programming time) based on the number of program data bits apparent in a set of input data bits by variably controlling the unit program accordingly.

Figure 4:
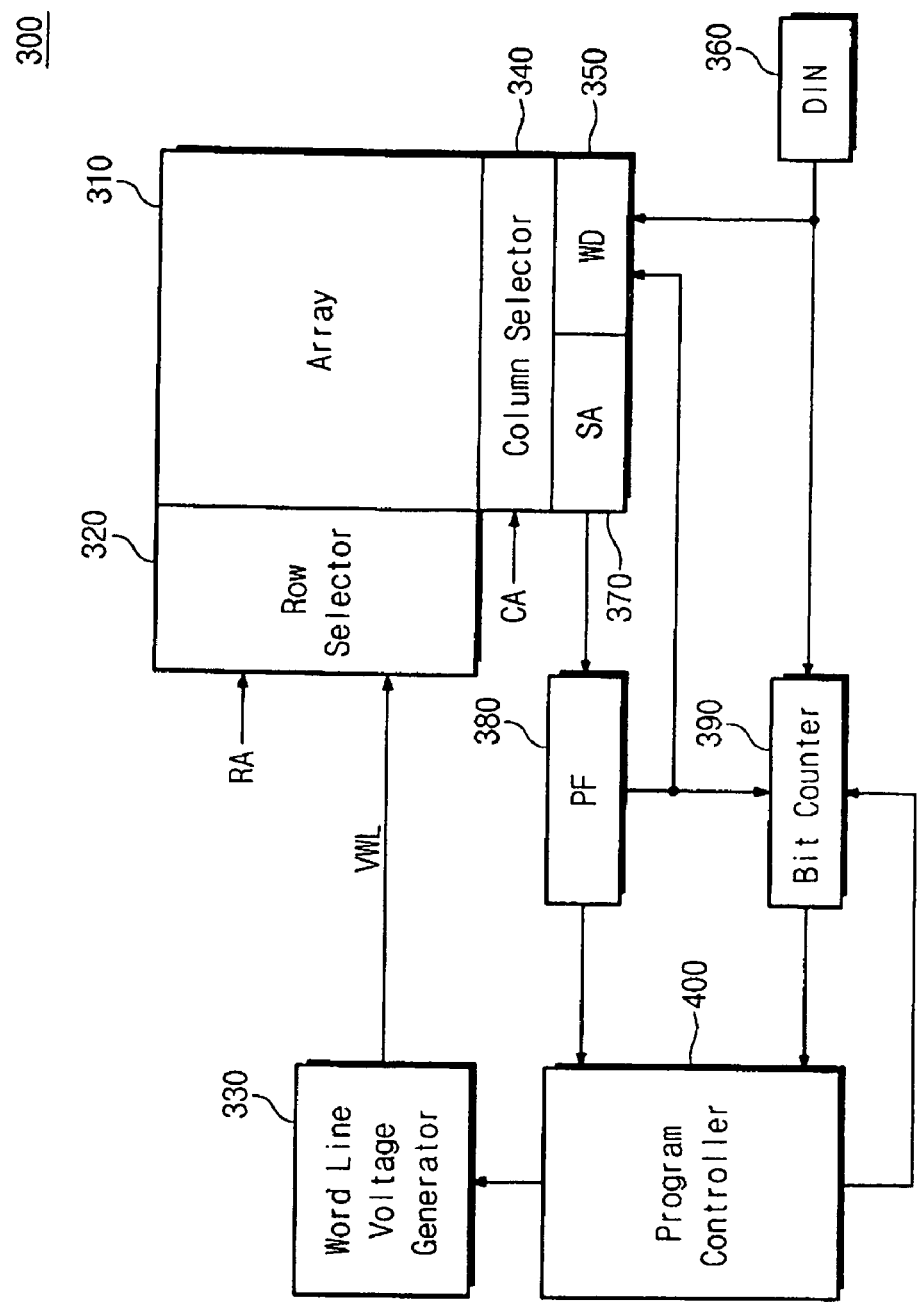
FIG. 4 shows a block diagram of a NOR flash memory device according to another embodiment of the present invention.

FIG. 4 is a block diagram showing a nonvolatile memory device according to another embodiment of the invention. Referring to FIG. 4, a NOR flash memory device 300 is shown and generally includes a memory cell array 310 comprising nonvolatile memory cells arranged in an array of word lines (or rows) and bit lines (or columns). A row selector circuit 320 selects at least one of the word lines in response to a row address RA and supplies a word line voltage VWL to the selected word line. A word line voltage generator circuit 330 is controlled by a program controller circuit 400 and generates the word line voltage VWL to be supplied to the selected word line. In the illustrated example, word line voltage generator circuit 330 is configured to generate the word line voltage VWL using incremental step pulse programming (ISPP) within the overall programming operation. Program controller circuit 400 controls the increment size for the word line voltage VWL, which may be varied in accordance with the number of program data bits that bit counter circuit 390 counts. Alternatively, program controller circuit 400 controls the unit program time, which may be varied in accordance with the number of program data bits that bit counter circuit 390 counts.

A column selector circuit 340 selects bit lines of memory cell array 310 according to a defined unit size (for example, x8, x16, x32, etc.) in response to a column address CA. During a programming operation, a write driver circuit 350 temporarily stores the data states transferred via the data input circuit 360 and drives bit lines, which are selected by column selector circuit 340, with a bit line voltage in accordance with the stored data states. During a read/verify operation, a sense amplifier circuit 370 senses and amplifies the logic states, either programmed or erased, of memory cells via bit lines selected by column selector circuit 340. During the verify operation, a pass/fail check circuit 380 outputs a judgment result to program controller circuit 400 in response to the states of the memory cells sensed by pass/fail check circuit 380. The sensed state for each one of the memory cells is provided to write driver circuit 350, so that programmed memory cells may be program-inhibited, if desired.

For example, assume that a data value to be programmed in a memory cell is "0". If the sensed state of the memory cell is "1" indicating an erased state, the data value temporarily stored in write driver circuit 350 for the memory cell is maintained at "0". This means that the memory cell must be programmed within the next program loop. That is, a bit line voltage is supplied to the bit line which is connected to the memory cell to be programmed.

If, however, the sensed state of the memory cell is "0" indicating a programmed state, the data value temporarily stored in write driver circuit 350 for the memory cell is changed from "0" to "1". This means that the memory cell must be program-inhibited within the next program loop.

During the programming operation, data input circuit 360 provides both write driver circuit 350 and bit counter circuit 390 with the data input. Bit counter circuit 390 counts (or calculates) the number of program data bits from the set of input data bits. Bit counter circuit 390 then provides program controller circuit 400 with the number of counted program data bits. Program controller circuit 400 is configured to control overall operation of the program loops. Program controller circuit 400 controls word line voltage generator circuit 330 so that the word line voltage VWL increment size is maintained at a reference value or increased above the reference value in accordance with the number of program data bits determined by bit counter circuit 390. Alternatively, program controller circuit 400 controls word line voltage generator circuit 330 so that the unit program time is maintained at the reference value or decreased below the reference value in accordance with the number of program data bits determined by bit counter circuit 390.

Program controller circuit 400 also controls bit counter circuit 390 during a program verify operation. Bit counter circuit 390 receives sensed data states from pass/fail check circuit 380 and calculates the number of program data bits in the sensed data states and provides controller circuit 400 with the number of counted program data bits.

Program controller circuit 400 controls word line voltage generator circuit 300 so that the word line voltage VWL increment size is maintained at a reference value or increased above the reference value in accordance with the number of program data bits counted by bit counter circuit 390 at each program loop, including repeated program loops. Alternatively, program controller circuit 400 controls the word line voltage generator circuit 300 so that the unit program time is maintained at the reference value or decreased below the reference value in accordance with the number of counted program data bits, counted by bit counter circuit 390 at each program loop including repeated program loops.

In one embodiment of the invention, the foregoing reference value for voltage is a voltage that corresponds to a voltage required when the set of input data bits contains all program data bits, and the foregoing reference value for unit program time is a time that corresponds to the unit program time required when the set of input data bits contains all program data bits.

So, in flash memory device 300, according to one embodiment of the invention, an initially determined configuration need not be maintained until the program mode of operation is ended. Thus, repeated program loops may be executed with voltage increment sizes that are different from the voltage increment size established in the initial program loop, or alternately, repeated program loops may be executed with unit program times that are different from the unit program time established in the initial program loop.

In conclusion, it is possible to reduce programming time by variously controlling either the increment size of the word line voltage or the unit program time in a given program loop in accordance with a number of counted program data bits.

The invention has been described using exemplary embodiments; however, the scope of the invention is not limited to the disclosed embodiments. Rather, it is intended to cover various modifications and similar arrangements. The scope of the claims, therefore, should be accorded the broadest interpretation so as to encompass all such modifications and similar arrangements.

What is claimed is:

1. A flash memory device, comprising:
a word line voltage generator circuit configured to generate a word line voltage, wherein the word line voltage is varied in accordance with an increment size; and,
a program controller circuit adapted to control the word line voltage generator circuit and further adapted to define the increment size in accordance with a number of program data bits in a set of input data bits.

2. The flash memory device of claim 1, wherein the program controller circuit executes a program loop comprising a program interval and a program verify interval; and,
wherein the increment size remains constant throughout the program interval.

3. The flash memory device of claim 2, further comprising:
a bit counter circuit configured to provide a first count to the program controller circuit, wherein the first count corresponds to the number of program data bits in the set of input data bits.

4. The flash memory device of claim 3, further comprising:
a plurality of memory cells;
a sense amplifier circuit configured to sense a plurality of data states from the plurality of memory cells;
a pass/fail check circuit configured to receive the plurality of data states from the sense amplifier circuit, provide the plurality of data states to the bit counter circuit, determine a judgment result from the plurality of data states, and provide the judgment result to the program controller circuit.

5. The flash memory device of claim 4, wherein the program controller circuit is further adapted to control the bit counter circuit to provide a second count to the program controller circuit, wherein the second count corresponds to the number of program data bits in the plurality of data states received from the pass/fail check circuit in relation to the program verify interval of the program loop.

6. The flash memory device of claim 5, wherein the program controller circuit executes a next program loop in accordance with the judgment result.

7. A method for controlling a flash memory device, comprising:
generating a word line voltage, wherein the word line voltage is varied in accordance with an increment size; and,
defining the increment size in accordance with a number of program data bits in a set of input data bits.

8. The method of claim 7, further comprising:
maintaining the increment size at a constant size throughout a program interval of a program loop, the program loop comprising the program interval and a program verify interval.

9. The method of claim 8, further comprising:
counting the number of program data bits in the set of input data bits; and,
storing the set of input data bits in a plurality of memory cells.

10. The method of claim 9, further comprising:
sensing a plurality of data states from the plurality of memory cells and providing the plurality of data states to a pass/fail check circuit;

determining a judgment result based on the plurality of data states in the pass/fail check circuit and providing the judgment result to a program controller circuit; and, providing the plurality of data states to a bit counter circuit.

11. The method of claim 10, further comprising:

counting the number of program data bits in the plurality of data states received from the pass/fail check circuit in relation to the program verify interval; and, providing the counted number of program data bits to the program controller circuit.

12. The method of claim 11, further comprising:

controlling a next program loop in accordance with the judgment result and the counted number of program data bits.

* * * * *